US010904982B2

(12) United States Patent
Smith et al.

(10) Patent No.: US 10,904,982 B2
(45) Date of Patent: *Jan. 26, 2021

(54) SYSTEMS AND METHODS FOR CONTROLLING SWITCHING CIRCUITRY

(71) Applicant: Control4 Corporation, Salt Lake City, UT (US)

(72) Inventors: Gregory Scott Smith, Woods Cross, UT (US); David Bytheway, Murray, UT (US); Robert Don Bruhn, Jr., West Jordan, UT (US); James K. Russell, Salt Lake City, UT (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,069

(22) Filed: Sep. 24, 2018

(65) Prior Publication Data
US 2020/0077490 A1  Mar. 5, 2020

Related U.S. Application Data

(60) Provisional application No. 62/727,323, filed on Sep. 5, 2018.

(51) Int. Cl.
H05B 37/02 (2006.01)
H05B 47/105 (2020.01)
H03M 1/00 (2006.01)
H03K 17/042 (2006.01)

(52) U.S. Cl.
CPC ..... *H05B 47/105* (2020.01); *H03K 17/04206* (2013.01); *H03M 1/002* (2013.01)

(58) Field of Classification Search
None
See application file for complete search history.

(56) References Cited

U.S. PATENT DOCUMENTS

| 10,473,699 | B1* | 11/2019 | Smith | H03K 17/166 |
| 2011/0204778 | A1* | 8/2011 | Sadwick | H05B 45/22 |
| | | | | 315/34 |
| 2013/0107584 | A1* | 5/2013 | Li | H02M 1/08 |
| | | | | 363/21.12 |
| 2013/0207559 | A1* | 8/2013 | Ferrier | H05B 33/0812 |
| | | | | 315/192 |
| 2019/0379278 | A1* | 12/2019 | Niv | H02M 7/062 |

* cited by examiner

Primary Examiner — Seokjin Kim
(74) Attorney, Agent, or Firm — Austin Rapp

(57) ABSTRACT

An electronic device for controlling switching circuitry is described. The electronic device includes line voltage measuring circuitry configured to measure a line voltage to produce a line voltage measurement. The electronic device also includes load voltage measuring circuitry configured to measure a load voltage to produce a load voltage measurement. The electronic device further includes a processor coupled to the line voltage measuring circuitry and the load voltage measuring circuitry. The processor is configured to adjust a control signal for a transition of the switching circuitry based on the line voltage measurement and the load voltage measurement to minimize heat generation and electromagnetic interference creation by the switching circuitry.

19 Claims, 4 Drawing Sheets

US 10,904,982 B2

SYSTEMS AND METHODS FOR CONTROLLING SWITCHING CIRCUITRY

RELATED APPLICATIONS

This application is related to and claims priority from U.S. Provisional Patent Application Ser. No. 62/727,323, filed Sep. 5, 2018, for "SYSTEMS AND METHODS FOR CONTROLLING SWITCHING CIRCUITRY," with first named inventor Gregory Scott Smith.

TECHNICAL FIELD

The present disclosure relates generally to electronic devices. More specifically, the present disclosure relates to systems and methods for controlling switching circuitry.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power. Safety is also a concern with some electronic devices. As can be observed from this discussion, improvements to electronic device ease of use, efficiency and/or safety may be beneficial.

DETAILED DESCRIPTION

Figure 1:
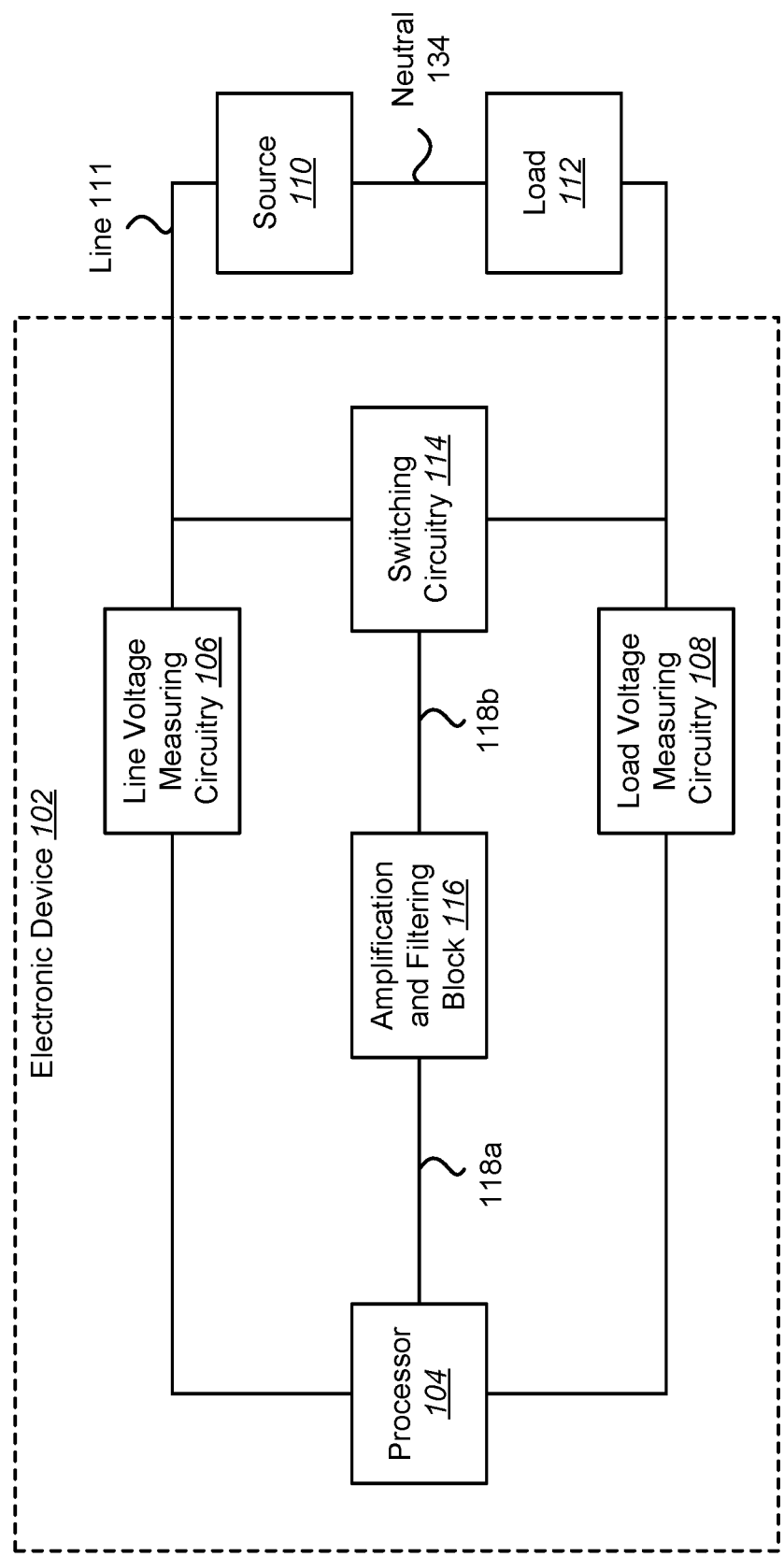
FIG. 1 is a block diagram illustrating one configuration of an electronic device for controlling switching circuitry.

An electronic device for controlling switching circuitry is described. The electronic device includes line voltage measuring circuitry configured to measure a line voltage to produce a line voltage measurement. The electronic device also includes load voltage measuring circuitry configured to measure a load voltage to produce a load voltage measurement. The electronic device further includes a processor coupled to the line voltage measuring circuitry and the load voltage measuring circuitry. The processor is configured to adjust a control signal for a transition of the switching circuitry based on the line voltage measurement and the load voltage measurement to minimize heat generation and electromagnetic interference creation by the switching circuitry.

The control signal may include a voltage waveform provided to a controlling gate input of the switching circuitry. The control signal may cause the switching circuitry to switch on and off at a controlled transition rate to reduce power delivered to a lighting load.

The processor may provide the control signal to an amplification and filtering block coupled to a controlling gate input of the switching circuitry. The amplification and filtering block may include an operational amplifier.

The processor may cause a digital-to-analog converter (DAC) to output the control signal. The processor may adjust the output of the DAC based on the line voltage measurement and the load voltage measurement to minimize heat generation and electromagnetic interference creation by the switching circuitry.

A transition rate to transition the switching circuitry from an on state to an off state or an off state to an on state may be determined by the processor. The transition rate may be determined based on the line voltage measurement and the load voltage measurement to minimize heat generation and electromagnetic interference creation by the switching circuitry.

The processor may adjust the control signal to cause the switching circuitry to transition as quickly as possible to minimize heat generation while shaping sections of the transition to minimize electromagnetic interference creation.

A method for controlling switching circuitry is also described. The method includes measuring a line voltage to produce a line voltage measurement. The method also includes measuring a load voltage to produce a load voltage measurement. The method further includes adjusting a control signal for a transition of the switching circuitry based on the line voltage measurement and the load voltage measurement to minimize heat generation and electromagnetic interference creation by the switching circuitry.

A non-transitory computer-readable medium for controlling switching circuitry is also described. The computer-readable medium includes executable instructions for measuring a line voltage to produce a line voltage measurement. The computer-readable medium also includes executable instructions for measuring a load voltage to produce a load voltage measurement. The computer-readable medium further includes executable instructions for adjusting a control signal for a transition of the switching circuitry based on the line voltage measurement and the load voltage measurement to minimize heat generation and electromagnetic interference creation by the switching circuitry.

Some configurations of the systems and methods disclosed herein may relate to controlling switching circuitry. For example, some configurations of the systems and methods disclosed herein may provide approaches for controlling switching circuitry for use in a lighting dimmer to reduce heat generation and electromagnetic interference. In some approaches, the electronic device (e.g., dimmer) may control power (e.g., voltage and/or current) to a load (e.g., lighting load).

In lighting dimmers, high power switching circuitry (e.g., active semiconductor devices) may be employed in a configuration where the switching circuitry either blocks or allows voltage and current to pass from the power lines to the lighting load. The switching circuitry may work as current gates that switch on and off at a controlled rate to reduce the power delivered to the lighting load to dim the light level.

An efficient way to control the switching circuitry is to turn the switching circuitry on and off as quickly as possible. The switching circuitry consumes electrical power internally when transitioning from off to on and back to off. Therefore, a fast transition from an off state to an on state and back from an on state to an off state reduces heat generation by the switching circuitry. However, a drawback to this quick switching is the creation of electromagnetic interference, which can be disruptive to other electronic devices and can exceed limits imposed by governmental regulatory agencies. In some approaches, the switching circuitry transition may be slowed down intentionally to reduce electromagnetic interference but at a cost of consuming more power within the switching circuitry and degrading the load driving potential of the switching circuitry.

In some approaches, a driver circuit for the switching circuitry makes sharp voltage jumps from low to high and high to low to switch the on and off states of the switching circuitry controlling power to a load (e.g., lighting load). With alternating current, the switching circuitry is employed in a configuration where the switching circuitry either blocks or allows current to flow to and from the load. The driver circuit drives the on/off control of the switching circuitry, which causes the switching circuitry to turn on and off at the desired rate and time.

In some approaches, electromagnetic interference from these turn on and turn off transitions is lowered by placing a resistor between the driver and the switching circuitry. These resistors interact with the built-in capacitance of the switching circuitry to slow the switching time seen at the controlling input of the switching circuitry, thus slowing the switching circuitry's delivery of voltage to the load. The larger the resistor, the slower this switching time. This resistor value may be selected large enough to balance reduced electromagnetic interference with acceptable lowered efficiency. However, these approaches do not provide precise control over the switching behavior of the switching circuitry because the ramping behavior follows a charge up of a capacitor through a resistor. This loss of constant control causes the voltage ramp to the switching circuitry to be slower in sections than needed. Therefore, in these approaches, to lower electromagnetic interference, unintended energy is consumed in the switching circuitry. This unintended energy consumption causes the switching circuitry to self-heat and decreases the driving potential of the switching circuitry.

The systems and methods described herein provide for actively shaping the controlling input of the switching circuitry (e.g., active semiconductor device) with a digital-to-analog (DAC) output from a processor (e.g., CPU). The processor may maintain control of the entire voltage ramp presented to the switching circuitry on/off control gate. The processor may cause the switching circuitry transition to be as quick as possible for heat reduction while shaping critical sections of the turn on/off transition to minimize electromagnetic interference creation. The processor may adjust the DAC's output shaping based on feedback from line and/or load voltage measurement circuitry. The processor may be in precise constant control of the control signal to the on/off control input of the switching circuitry.

Some of the configurations described herein may provide one or more benefits. For example, dynamically controlling the switching circuitry's turn on and off transitions allows the switching circuitry to run more efficiently while keeping the electromagnetic interference low. This greater efficiency reduces power waste. In a lighting system, the systems and methods described herein may increase the lighting system's production of light per watt. Self-generated heat may be lowered within the switching circuitry, which can increase the life expectancy of the switching circuitry and the longevity of the light dimming system.

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for controlling switching circuitry 114. The electronic device 102 may include a processor 104, line voltage measuring circuitry 106, load voltage measuring circuitry 108, switching circuitry 114, and/or an amplification and filtering block 116. The processor 104 may be coupled to the line voltage measuring circuitry 106, the load voltage measuring circuitry 108, to the amplification and filtering block 116 and/or to the switching circuitry 114 (via the amplification and filtering block 116, for instance).

Examples of electronic devices 102 include electronic circuits, integrated circuits, circuits with discrete components (e.g., resistors, capacitors, transistors, metal-oxide-semiconductor field-effect transistors (MOSFETs), etc.), computers, and/or devices that include one or more processors, memory cells, latches, logic gates, etc. For instance, the electronic device 102 may be a switch and/or a dimmer that includes discrete components and a processor 104 (e.g., microprocessor) that may be used to control switching circuitry. The processor 104 may include and/or access software in memory and/or firmware. For example, the electronic device 102 may include memory. The memory may be included on-board the processor 104 or may be separate from the processor 104. The memory may store instructions and/or data (e.g., samples, voltage samples, and/or current samples, etc.). Additionally or alternatively, the memory or a separate memory may store firmware. In some configurations, the electronic device 102 may be a semiconductor-based dimmer (e.g., a MOSFET-based dimmer, a TRIAC-based dimmer, etc.). Additionally or alternatively, the electronic device 102 may be a phase-cut dimmer in some implementations. In some configurations, the electronic device 102 may be housed within a wall box. In some configurations, the electronic device 102 may be housed within a panel (e.g., lighting panel).

The electronic device 102 may be coupled to a source 110 (e.g., an alternating current (AC) voltage source) and/or to a load 112. For example, the electronic device 102 may be coupled to the source 110 on a line 111 coupling (e.g., line 111 terminal) and a neutral 134 coupling (e.g., neutral 134 terminal). For example, an AC voltage may be provided to the electronic device 102 through the feed line 111. In some configurations, the source 110 may output an AC voltage (e.g., 240 volts (V), 120 V, etc.). The AC voltage may be provided to the electronic device 102 between the line 111 (e.g., "hot") and neutral 134. The voltage between the line 111 and neutral 134 may be referred to as line voltage.

The electronic device 102 may be coupled to a load 112. For example, the switching circuitry 114 of the electronic device 102 may be coupled to the load 112. The load 112 may also be coupled to the electronic device 102 at neutral 134 (e.g., a neutral line). The switching circuitry 114 may activate or deactivate the load 112. For example, the switching circuitry 114 state may allow current and voltage to pass from the source 110 to the load 112 when the load 112 is activated (e.g., when voltage is supplied to the load 112, the load 112 is "turned on"). In some implementations, the switching circuitry 114 may include two switches (e.g., MOSFETs, MOSFETs with coupled drains, etc.).

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform. However, some inductive loads may have very little current lag. For example, some toroidal MLV loads may have power factors that are very close to 1 (where resistive loads may have a power factor of 1).

Capacitive load types may have a detectable amount of capacitance. Examples of capacitive loads are dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply.

Resistive load types may exhibit current and voltage waveforms in phase with each other. For example, there may be no significant (e.g., discernible) lead or lag between current and voltage in resistive load types. Examples of resistive loads include incandescent and halogen lights.

The electronic device 102 (e.g., processor 104 and/or switching circuitry 114) may control the amount of power delivered to the load 112. In some configurations (e.g., switch, dimmer, etc.), the switching circuitry 114 may turn on (e.g., activate) the power or turn off (e.g., deactivate) the power to the load 112. Additionally or alternatively, the electronic device 102 (e.g., processor 104 and/or switching circuitry 114) may adjust the amount of power that is delivered to the load 112 (e.g., enable, disable, adjust duty cycle, cut phase, increase phase, etc.). Examples of the switching circuitry 114 may include one or more switches (e.g., mechanical relay, solid state relay, MOSFETs, transistors, etc.). The switching circuitry 114 may include discrete components. In some configurations, the switching circuitry 114 may only include discrete components.

The switching circuitry 114 may include a controlling gate input. A control signal 118b received at the controlling gate input may cause the switching circuitry 114 to transition from an off to an on state or an on state to an off state.

In some configurations, the electronic device 102 may be a dimmer and/or may include a dimmer. For example, the switching circuitry 114 may activate and/or deactivate the load 112 (periodically and/or cyclically, for instance) in order to achieve a particular dimming level. This may be referred to as "phase-cut" dimming, where different amounts (e.g., time segments, portions, etc.) of load voltage may be cut (e.g., deactivated) in order to produce different dimming levels. When no portion of the load voltage is cut, the load 112 may be driven in a fully activated state, where the full cycle of load voltage is provided. This may be referred to as a "full-on" (e.g., 100%) dimming level (e.g., a dimming level of no dimming). A range of cycle portions may be cut according to dimming level. For example, a half (e.g., 50%) dimming level may cut approximately half of the load voltage cycle. Other dimming levels (e.g., 0%, 25%, 33%, 75%, 90%, etc.) may similarly be achieved by controlling the switching circuitry 114 to cut corresponding portions from the load voltage cycle.

A line voltage may be a voltage on the line 111 (e.g., between line couplings, between line terminals, between the switching circuitry 114 and neutral 134, etc.). The line voltage measuring circuitry 106 is configured to measure the line voltage to produce a line voltage measurement (e.g., a voltage waveform). For example, the line voltage measuring circuitry 106 may continuously capture the line voltage measurement (e.g., voltage waveform) by sampling the line voltage for one or more cycles of AC voltage (across the source 110 or across the line 111 and neutral 134, for instance). The measured line voltage and/or line voltage measurement may be provided to the processor 104. The line voltage measuring circuitry 106 may include discrete components (e.g., one or more resistors, capacitors, transistors, amplifiers, chip packages, etc.). In some configurations, the line voltage measuring circuitry 106 may only include discrete components.

In some configurations, the line voltage measuring circuitry 106 may capture a continuous time (e.g., analog) voltage waveform. The continuous time voltage waveform may represent how the line voltage varies over each cycle. In some configurations, the electronic device 102 may include and/or utilize an analog-to-digital converter (ADC) for capturing a discrete time (e.g., digital) voltage waveform of the line voltage by sampling the continuous time voltage waveform. For example, the ADC may sample at sufficient intervals to capture how the line voltage varies over one or more cycles. A digital voltage waveform may be one example of the line voltage measurement.

A load voltage may be a voltage between electronic device 102 lines for a load (e.g., between load couplings, between load terminals, between the switching circuitry 114 and neutral 134, etc.). The load voltage measuring circuitry 108 is configured to measure the load voltage to produce a load voltage measurement (e.g., a voltage waveform). For example, the load voltage measuring circuitry 108 may continuously capture the load voltage measurement (e.g., voltage waveform) by sampling the load voltage for one or more cycles of AC voltage (across the load 112, for instance). The measured load voltage and/or load voltage measurement may be provided to the processor 104. The load voltage measuring circuitry 108 may include discrete components (e.g., one or more resistors, capacitors, transistors, amplifiers, chip packages, etc.). In some configurations, the load voltage measuring circuitry 108 may only include discrete components.

In some configurations, the load voltage measuring circuitry 108 may capture a continuous time (e.g., analog) voltage waveform. The continuous time voltage waveform may represent how the load voltage varies over each cycle. In some configurations, the electronic device 102 may include and/or utilize an analog-to-digital converter (ADC) for capturing a discrete time (e.g., digital) voltage waveform of the load voltage by sampling the continuous time voltage waveform. For example, the ADC may sample at sufficient intervals to capture how the load voltage varies over one or more cycles. A digital voltage waveform may be one example of the load voltage measurement.

It should be noted that the load voltage measurement may be distinct from the line voltage measurement. For example, the load voltage measurement may indicate a load voltage across a load 112, while a line voltage measurement may indicate a line voltage across a source 110. In some configurations, the load voltage may be on a different side of the switching circuitry 114 than the line voltage. For example, the line voltage may be taken from the line 111 feed of the electronic device 102 (e.g., on the "front" side of the switching circuitry 114), while the load voltage may be taken from across the load 112 (e.g., on the "back" side of the switching circuitry 114).

In some configurations, the processor 104 may adjust a control signal 118a for a transition of the switching circuitry 114 based on the line voltage measurement and the load voltage measurement to minimize heat generation and electromagnetic interference creation by the switching circuitry 114. For example, the processor 104 may generate a control signal 118a to cause the switching circuitry 114 to switch on and off at a controlled transition rate to reduce the power delivered to a load 112 (e.g., lighting load). The control signal 118a may be a voltage waveform that is sent to a controlling gate input of the switching circuitry 114.

In some implementations, the processor 104 may provide the control signal 118a to an amplification and filtering block 116 coupled to the controlling gate input of the switching circuitry 114. For example, the amplification and filtering block 116 may be implemented as an operational amplifier (op-amp). The control signal 118a produced by the processor 104 may have discrete steps. The amplification and filtering block 116 may amplify the control signal 118a to voltage levels that are sufficient to drive the transition of the switching circuitry 114. The amplification and filtering block 116 may also smooth the steps of the control signal 118a using filtering. The amplified and filtered control signal 118b (e.g., voltage waveform) may be provided to the switching circuitry 114. It should be noted that the control signal 118a generated by the processor 104 and the amplified and filtered control signal 118b may be referred to as a control signal 118.

In some implementations, the processor 104 causes a digital-to-analog converter (DAC) (not shown) to output the control signal 118a. Therefore, control signal 118a provided to the amplification and filtering block 116 may be an analog signal. The processor 104 may adjust the output of the DAC based on the line voltage measurement and the load voltage measurement to minimize heat generation and electromagnetic interference creation by the switching circuitry 114.

The processor 104 may adjust the control signal 118a based on feedback from the line voltage measuring circuitry and/or load voltage measuring circuitry 108. For example, a transition rate to transition the switching circuitry from an on state to an off state or an off state to an on state may be determined by the processor 104 based on the line voltage measurement and the load voltage measurement. The transition rate may be determined based on the line voltage measurement and the load voltage measurement to minimize heat generation and electromagnetic interference creation by the switching circuitry 114.

In an example, the load voltage measurement and/or line voltage measurement may indicate that the switching circuitry 114 is transitioning from off to on too quickly, which may create significant electromagnetic interference. In this case, the processor 104 may decrease the voltage waveform of the control signal 118a to slow down the transition rate.

In another example, the load voltage measurement and/or line voltage measurement may indicate that the switching circuitry 114 is transitioning from off to on too slowly, which may cause excessive heat generation in the switching circuitry 114. In this case, the processor 104 may increase the voltage waveform of the control signal 118a to speed up the transition rate.

As seen by these examples, because the processor 104 is in precise constant control of the control signal 118a to the on/off control input of the switching circuitry 114, the processor 104 may adjust the control signal 118a to cause the switching circuitry 114 to transition as quickly as possible to minimize heat generation. The processor 104 may also adjust the control signal 118a by shaping sections of the transition to minimize electromagnetic interference creation.

In some configurations, the electronic device 102 may be housed in a wall box or lighting panel. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally or alternatively, a spacer may be utilized in some configurations that places a portion of the device (e.g., an electronic device 102) outside of a wall box.

A wall box dimmer is another example of an electronic device 102 with variable states that may be used to control a load 112. A wall box dimmer may variably adjust the amount of electrical power that is driven to the load 112 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the switching circuitry 114, processor 104, amplification and filtering block 116, line voltage measuring circuitry 106, and/or load voltage measuring circuitry 108 may be divided into smaller elements or components that perform a subset of the functions described herein. Additionally or alternatively, one or more of the switching circuitry 114, processor 104, amplification and filtering block 116, line voltage measuring circuitry 106, and/or load voltage measuring circuitry 108 may be combined.

Figure 2:
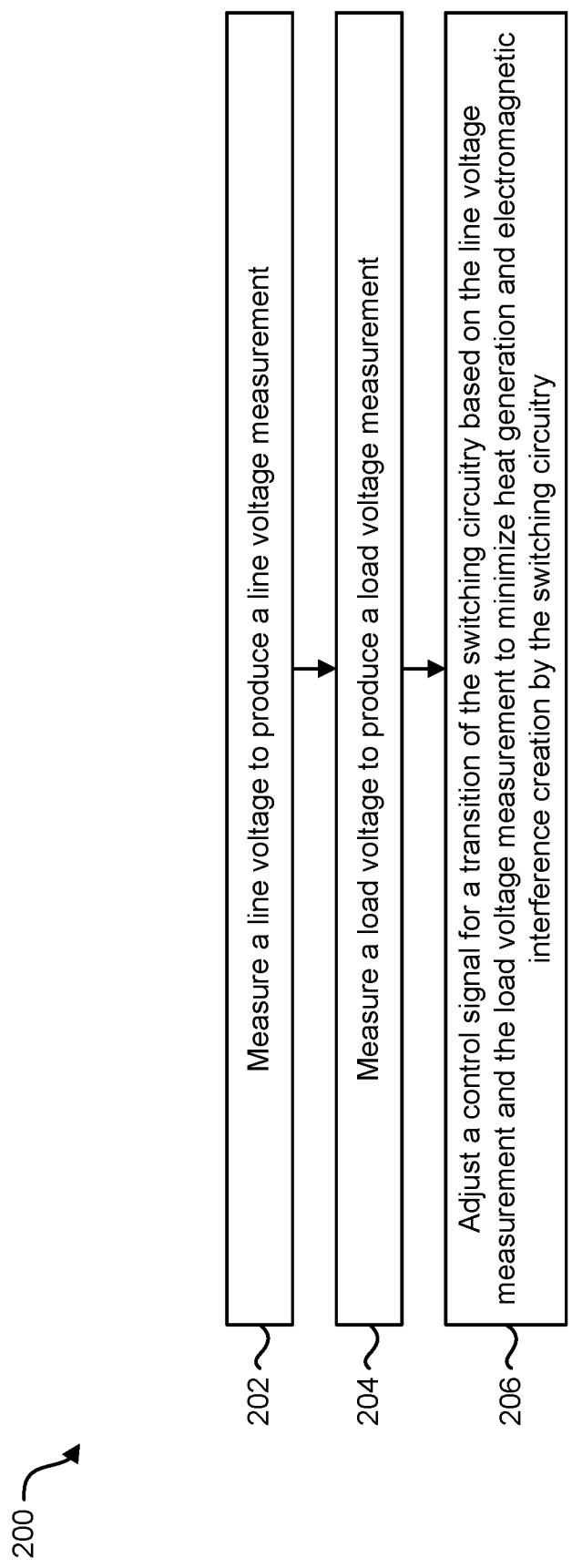
FIG. 2 is a flow diagram illustrating one configuration of a method for controlling switching circuitry.

FIG. 2 is a flow diagram illustrating one configuration of a method 200 for controlling switching circuitry 114. The method 200 may be performed by the electronic device 102 described in relation to FIG. 1. The electronic device 102 may measure 202 a line voltage to produce a line voltage measurement. This may be accomplished as described in relation to FIG. 1. For example, the electronic device 102 (e.g., line voltage measuring circuitry 106) may measure 202 the line voltage as a line voltage measurement (e.g., a voltage waveform, a series of voltage data samples, etc.). The line voltage measurement may indicate the line voltage (e.g., voltage across a source 110) for one or more cycles (e.g., AC voltage cycles).

The electronic device 102 may measure 204 a load voltage to produce a load voltage measurement. This may be accomplished as described in relation to FIG. 1. For example, the electronic device 102 (e.g., load voltage measuring circuitry 108) may measure 204 the load voltage as a load voltage measurement (e.g., a voltage waveform, a series of voltage data samples, etc.). The load voltage measurement may indicate the load voltage (e.g., voltage across a load 112) for one or more cycles (e.g., AC voltage cycles).

The electronic device 102 may adjust 206 a control signal 118 for a transition of switching circuitry 114 based on the line voltage measurement and the load voltage measurement to minimize heat generation and electromagnetic interference creation by the switching circuitry 114. This may be accomplished as described in relation to FIG. 1. For example, the electronic device 102 (e.g., processor 104) may adjust the control signal 118 to cause the switching circuitry 114 to transition as quickly as possible to minimize heat generation while shaping sections of the transition to minimize electromagnetic interference creation. A transition rate to transition the switching circuitry 114 from an on state to an off state or an off state to an on state may be determined by the processor 104. The transition rate may be determined based on the line voltage measurement and the load voltage measurement to minimize heat generation and electromagnetic interference creation by the switching circuitry.

The control signal 118 may be a voltage waveform provided to a controlling gate input of the switching circuitry 114. The control signal 118 may cause the switching circuitry 114 to switch on and off at a controlled transition rate to reduce the power delivered to a load 112 (e.g., lighting load) in an AC circuit. In some implementations, the processor 104 may provide the control signal to an amplification and filtering block 116 coupled to the controlling gate input of the switching circuitry 114.

In some implementations, the processor 104 may cause a digital-to-analog converter (DAC) to output the control signal 118. The processor 104 may adjust the output of the DAC based on the line voltage measurement and the load voltage measurement to minimize heat generation and electromagnetic interference creation by the switching circuitry 114.

Figure 3:
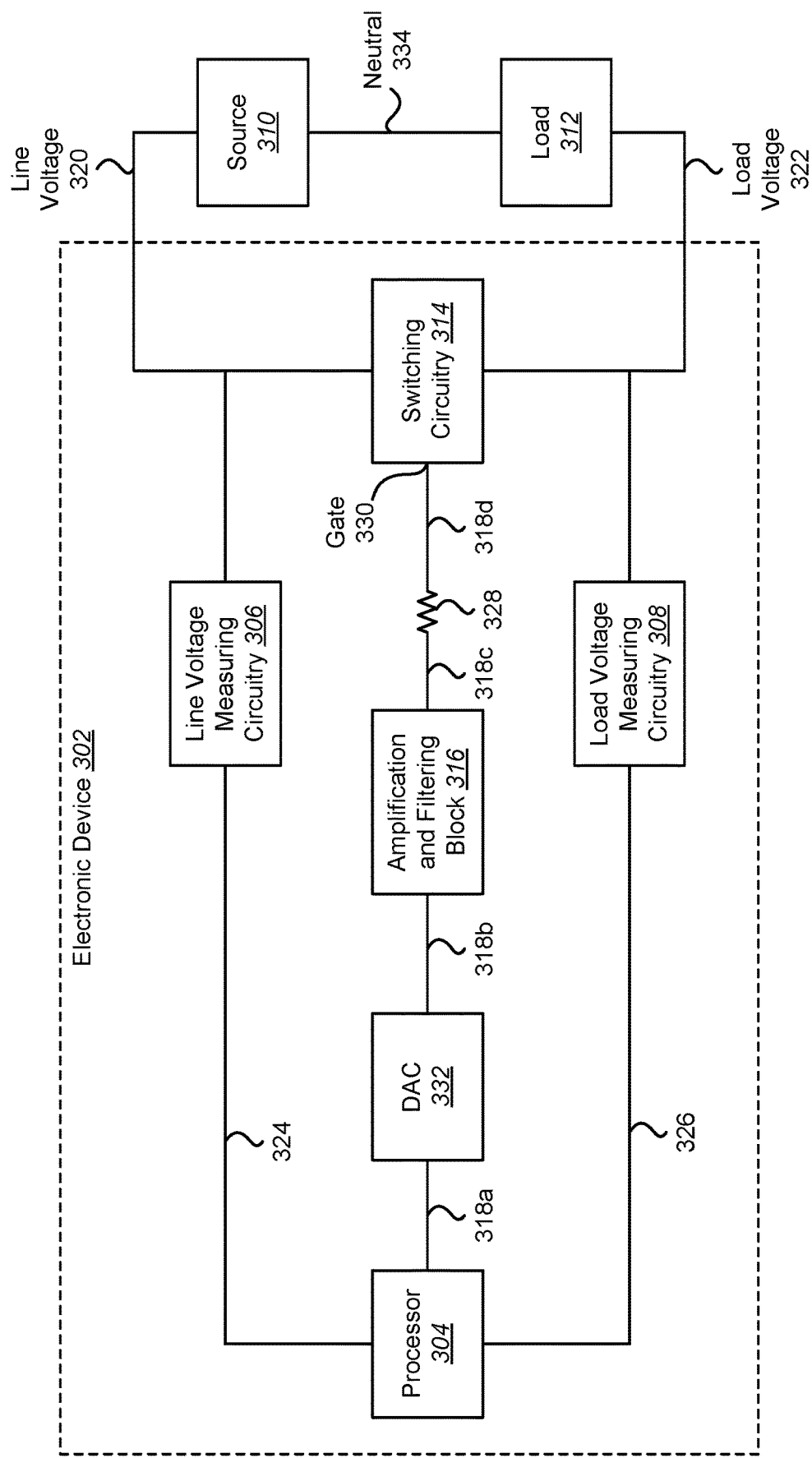
FIG. 3 is a block diagram illustrating a more specific configuration of an electronic device for controlling switching circuitry.

FIG. 3 is a block diagram illustrating a more specific configuration of an electronic device 302 for controlling switching circuitry 314. The electronic device 302 may include a processor 304, switching circuitry 314, line voltage measuring circuitry 306, load voltage measuring circuitry 308, an amplification and filtering block 316 and/or a DAC 332. The processor 304 may be coupled to the line voltage measuring circuitry 306, to the load voltage measuring circuitry 308, and/or to the DAC 332.

The electronic device 302 described in relation to FIG. 3 may be an example of the electronic device 102 described in relation to FIG. 1. One or more of the elements or components described in relation to FIG. 3 may function similarly and/or may be implemented similarly to one or more corresponding elements or components described in relation to FIG. 1. For example, the source 310, load 312, switching circuitry 314, processor 304, line voltage measuring circuitry 306, and/or load voltage measuring circuitry 308 of FIG. 3 may function and/or may be implemented as described in relation to one or more of the source 110, load 112, switching circuitry 114, processor 104, line voltage measuring circuitry 106, and/or load voltage measuring circuitry 108 of FIG. 1. It should be noted that the source 310 and/or the load 312 may be separate from the electronic device 302, may be coupled to the electronic device 302, and/or may not be included in the electronic device 302. The switching circuitry 314 may be coupled to the source 310 and the load 312. A neutral 334 line may be coupled between the source 310 and the load 312.

The line voltage measuring circuitry 306 is configured to measure the line voltage 320 to produce a line voltage measurement 324. The load voltage measuring circuitry 308 is configured to measure the load voltage 322 to produce a load voltage measurement 326.

The DAC 332 may receive a digital control signal 318a from the processor 304. The DAC 332 may convert the digital control signal 318a to an analog control signal 318b. The analog control signal 318b output of the DAC 332 may be a waveform that minimizes heat generation by the switching circuitry 314 while shaping sections of the switching circuitry transition to minimize electromagnetic interference creation.

The amplification and filtering block 316 may amplify the analog control signal 318b to voltage levels that are sufficient to drive the transition of the switching circuitry 314. The amplification and filtering block 316 may also smooth the steps of the analog control signal 318b using filtering. The amplification and filtering block 316 may output an amplified and filtered control signal 318c (e.g., voltage waveform).

In some implementations, a resistor 328 may be coupled between the output of the amplification and filtering block 316 and the controlling gate input 330 of the switching circuitry 314. The controlling gate input 330 may receive the control signal 318d that passes through the resistor 328. In some implementations, the resistor 328 may be a small-valued resistor placed between this driving circuitry and the switching circuitry 314 to minimize oscillation. The value of the resistor 328 may be kept low to minimize interaction with the capacitance of the controlling input of the switching circuitry 314 so the switching circuitry 314 can be precisely controlled.

In some configurations, the processor 304, load voltage measuring circuitry 308, and/or line voltage measuring circuitry 306 may be utilized to adjust the control signal 318 for a transition of the switching circuitry 314. This may be accomplished as described in connection with FIG. 1. For example, the load voltage measuring circuitry 308 may be utilized to produce a load voltage measurement 326 that is provided to the processor 304. The line voltage measuring circuitry 306 may be utilized to produce a line voltage measurement 324 that is provided to the processor 304. The processor 304 may use the line voltage measurement 324 and/or the load voltage measurement 326 as feedback to adjust the control signal 318a used to regulate the transition of the switching circuitry 314.

In some configurations, the switching circuitry 314 may be configured to perform switching based on the control signal 318d received at the gate input 330. For example, the switching circuitry 314 may switch on and off at a controlled transition rate to reduce the power delivered to a 312 load. The transition rate to transition the switching circuitry 314 from an on state to an off state or an off state to an on state may be determined by the processor 304 based on the line voltage measurement 324 and/or the load voltage measurement 326 feedback.

If the load voltage measurement 326 and/or line voltage measurement 324 indicate that the switching circuitry 314 is transitioning from off to on too quickly (which may create significant electromagnetic interference), then the processor 304 may decrease the voltage waveform of the control signal 318a by changing the shape and/or amplitude of the control signal 318a (e.g., decrease the voltage seen at the gate input 330) to slow down the transition rate. In one approach, the processor 304 may offset the voltage waveform of the control signal 318a lower. In another approach, the processor 304 may change the curve of the voltage waveform to decrease the voltage waveform.

If the load voltage measurement 326 and/or line voltage measurement 324 indicate that the switching circuitry 314 is transitioning from off to on too slowly (which may cause excessive heat generation in the switching circuitry 114), then the processor 304 may increase the voltage waveform of the control signal 318a by changing the shape and/or amplitude of the control signal 318a (e.g., increase the voltage seen at the gate input 330) to speed up the transition rate. In one approach, the processor 304 may offset the voltage waveform of the control signal 318a higher. In another approach, the processor 304 may change the curve of the voltage waveform to increase the voltage waveform.

It should be noted that one or more of the elements or components described in relation to FIG. 3 may be combined and/or divided in some configurations. For example, processor 304, switching circuitry 314, line voltage measuring circuitry 306, load voltage measuring circuitry 308, an amplification and filtering block 316 and/or a DAC 332 may be divided into smaller elements or components that perform a subset of the functions described herein. Additionally or alternatively, one or more of the processor 304, switching circuitry 314, line voltage measuring circuitry 306, load voltage measuring circuitry 308, an amplification and filtering block 316 and/or a DAC 332 may be combined. For example, the DAC 332 may be combined with the processor 304 in some configurations.

Figure 4:
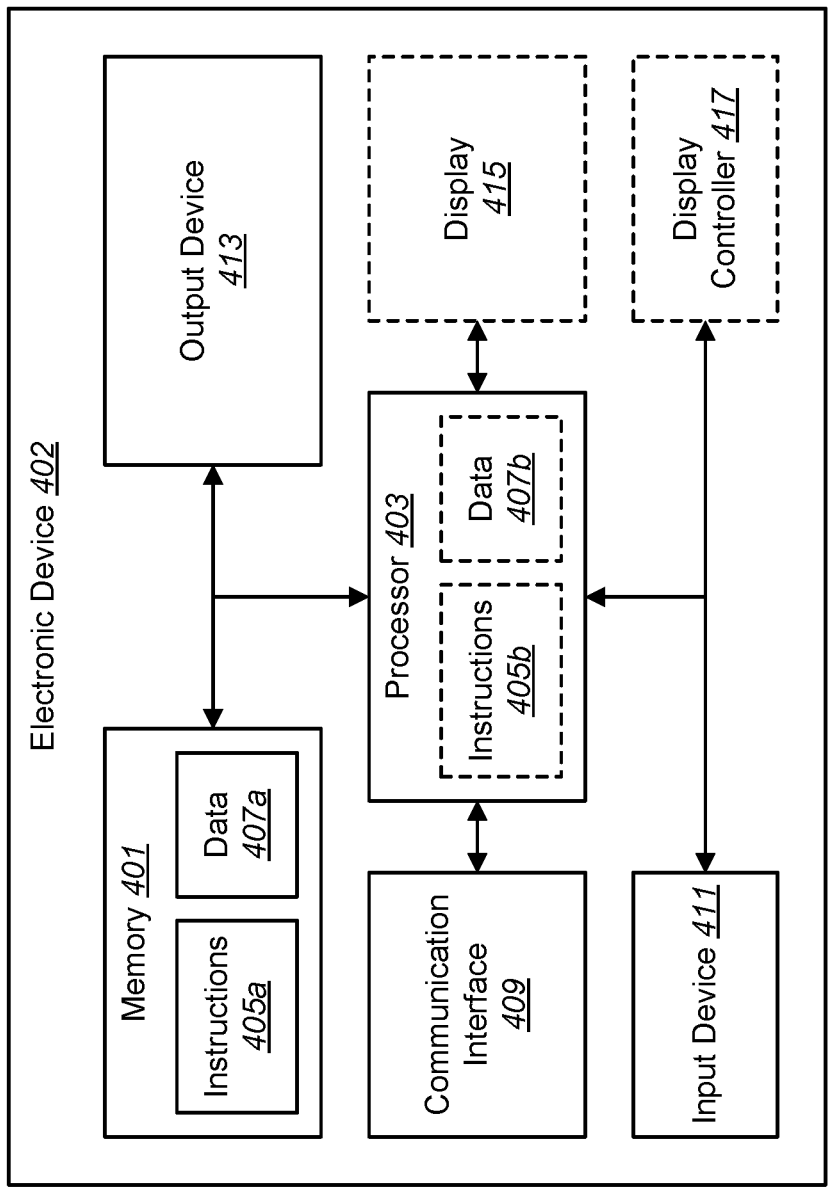
FIG. 4 illustrates various components that may be utilized in an electronic device.

FIG. 4 illustrates various components that may be utilized in an electronic device 402. The electronic device 402 described in connection with FIG. 4 may be configured in accordance with one or more of the electronic devices 102, 302 described herein. For example, the electronic device 402 may be configured to perform one or more of the methods 200 described above. The electronic device 402 may include a memory 401, a communication interface 409, an input device 411, a processor 403, an output device 413, a display 415, and/or a display controller 417. The memory 401 may store instructions 405a and data 407a. The processor 403 may operate on instructions 405b and data 407b. It should be noted that the display 415 and/or display controller 417 may be optional. For example, some configurations of the electronic device 402 may not have a display. Additionally or alternatively, some configurations of the electronic device 402 may include a button interface (e.g., an input device 411). Some configurations of the electronic device 402 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device for controlling switching circuitry, comprising:
   line voltage measuring circuitry configured to measure a line voltage to produce a line voltage measurement of an alternating current (AC) voltage source;
   load voltage measuring circuitry configured to measure a load voltage to produce a load voltage measurement; and
   a processor coupled to the line voltage measuring circuitry and the load voltage measuring circuitry, wherein the processor is configured to adjust a control signal for a transition of the switching circuitry based on the line voltage measurement and the load voltage measurement to minimize heat generation and electromagnetic interference creation by the switching circuitry, and wherein the processor provides the control signal to an amplification and filtering block coupled to a controlling gate input of the switching circuitry.

2. The electronic device of claim 1, wherein the control signal comprises a voltage waveform provided to a controlling gate input of the switching circuitry.

3. The electronic device of claim 1, wherein the amplification and filtering block comprises an operational amplifier.

4. The electronic device of claim 1, wherein the control signal causes the switching circuitry to switch on and off at a controlled transition rate to reduce power delivered to a lighting load.

5. The electronic device of claim 1, wherein the processor causes a digital-to-analog converter (DAC) to output the control signal, wherein the processor adjusts the output of the DAC based on the line voltage measurement and the load voltage measurement to minimize heat generation and electromagnetic interference creation by the switching circuitry.

6. The electronic device of claim 1, wherein a transition rate to transition the switching circuitry from an on state to an off state or an off state to an on state is determined by the processor.

7. The electronic device of claim 6, wherein the transition rate is determined based on the line voltage measurement and the load voltage measurement to minimize heat generation and electromagnetic interference creation by the switching circuitry.

8. The electronic device of claim 1, wherein the processor adjusts the control signal to cause the switching circuitry to transition to minimize heat generation while shaping sections of the transition to minimize electromagnetic interference creation.

9. A method for controlling switching circuitry, comprising:
   measuring a line voltage to produce a line voltage measurement of an alternating current (AC) voltage source;
   measuring a load voltage to produce a load voltage measurement; and
   adjusting a control signal for a transition of the switching circuitry based on the line voltage measurement and the load voltage measurement to minimize heat generation and electromagnetic interference creation by the switching circuitry, wherein the control signal is provided to an amplification and filtering block coupled to a controlling gate input of the switching circuitry.

10. The method of claim 9, wherein the control signal comprises a voltage waveform provided to a controlling gate input of the switching circuitry.

11. The method of claim 9, wherein the control signal causes the switching circuitry to switch on and off at a controlled transition rate to reduce power delivered to a lighting load.

12. The method of claim 9, further comprising causing a digital-to-analog converter (DAC) to output the control signal, wherein the output of the DAC is adjusted based on the line voltage measurement and the load voltage measurement to minimize heat generation and electromagnetic interference creation by the switching circuitry.

13. The method of claim 9, further comprising determining a transition rate to transition the switching circuitry from an on state to an off state or an off state to an on state based on the line voltage measurement and the load voltage measurement to minimize heat generation and electromagnetic interference creation by the switching circuitry.

14. The method of claim 9, wherein adjusting the control signal comprises causing the switching circuitry to transition to minimize heat generation and shaping sections of the transition to minimize electromagnetic interference creation.

15. A non-transitory computer-readable medium for controlling switching circuitry, the computer-readable medium comprising executable instructions for:
   measuring a line voltage to produce a line voltage measurement of an alternating current (AC) voltage source;
   measuring a load voltage to produce a load voltage measurement; and adjusting a control signal for a transition of the switching circuitry based on the line voltage measurement and the load voltage measurement to minimize heat generation and electromagnetic interference creation by the switching circuitry, wherein the control signal is provided to an amplification and filtering block coupled to a controlling gate input of the switching circuitry.

16. The computer-readable medium of claim 15, wherein the control signal comprises a voltage waveform provided to a controlling gate input of the switching circuitry.

17. The computer-readable medium of claim 15, further comprising executable instructions for causing a digital-to-analog converter (DAC) to output the control signal, wherein the output of the DAC is adjusted based on the line voltage measurement and the load voltage measurement to minimize heat generation and electromagnetic interference creation by the switching circuitry.

18. The computer-readable medium of claim 15, further comprising executable instructions for determining a transition rate to transition the switching circuitry from an on state to an off state or an off state to an on state based on the line voltage measurement and the load voltage measurement to minimize heat generation and electromagnetic interference creation by the switching circuitry.

19. The computer-readable medium of claim 15, wherein adjusting the control signal comprises causing the switching circuitry to transition to minimize heat generation and shaping sections of the transition to minimize electromagnetic interference creation.

* * * * *